United States Patent
Xiong et al.

(10) Patent No.: US 7,758,695 B2
(45) Date of Patent: Jul. 20, 2010

(54) METHOD FOR FABRICATING METAL SUBSTRATES WITH HIGH-QUALITY SURFACES

(75) Inventors: Chuanbing Xiong, Nanchang (CN); Wenqing Fang, Nanchang (CN); Li Wang, Nanchang (CN); Guping Wang, Nanchang (CN); Fengyi Jiang, Nanchang (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 675 days.

(21) Appl. No.: 11/713,423

(22) Filed: Mar. 2, 2007

(65) Prior Publication Data

US 2008/0166582 A1 Jul. 10, 2008

(30) Foreign Application Priority Data

Jan. 8, 2007 (CN) .................. 2007 1 0001586

(51) Int. Cl.
*C30B 1/02* (2006.01)
(52) U.S. Cl. .................. 117/2; 117/4; 117/8; 117/9; 117/917
(58) Field of Classification Search ............... 117/917, 117/2, 4, 9, 94, 105, 109; 148/122.2
See application file for complete search history.

(56) References Cited

U.S. PATENT DOCUMENTS 5,168,078 A * 12/1992 Reisman et al. ............. 438/455
6,172,408 B1 * 1/2001 Seto et al. .................... 257/458
6,824,610 B2 * 11/2004 Shibata et al. ................ 117/89

* cited by examiner

*Primary Examiner*—Robert M Kunemund
(74) *Attorney, Agent, or Firm*—Park, Vaughan & Fleming LLP (57) ABSTRACT

One embodiment of the present invention provides a method for fabricating a high-quality metal substrate. During operation, the method involves cleaning a polished single-crystal substrate. A metal structure of a predetermined thickness is then formed on a polished surface of the single-crystal substrate. The method further involves removing the single-crystal substrate from the metal structure without damaging the metal structure to obtain the high-quality metal substrate, wherein one surface of the metal substrate is a high-quality metal surface which preserves the smoothness and flatness of the polished surface of the single-crystal substrate.

28 Claims, 7 Drawing Sheets

METHOD FOR FABRICATING METAL SUBSTRATES WITH HIGH-QUALITY SURFACES

RELATED APPLICATION

This application hereby claims priority under 35 U.S.C. §119 to the following foreign patent application: China Patent Application No. 200710001586.3, filed 8 Jan. 2007.

BACKGROUND

1. Field of the Invention

The present invention relates to techniques for semiconductor device manufacturing. More specifically, the present invention relates to a method for fabricating a substrate with at lest one high-quality surface for growing semiconductor structures.

2. Related Art

Semiconductor device manufacturing relies on polished mirror-like substrates as bases or supporting structure to grow layers of thin-film materials and semiconductor structures. Typically, one or both surfaces of a silicon (Si) single-crystal substrate can be polished to a roughness less than a few nanometers. Furthermore, the surfaces of these Si substrates can be prepared to exhibit specific crystal orientations, which are preferable to the subsequent epitaxial growth of semiconductor structures.

Recently, increasing research activities have been focused on using metals or alloys as substrate materials. In comparison with conventional non-metal substrates, metal substrates possess some superior properties, which include excellent thermal conductivity, electrical conductivity, and optical reflectivity. These metal substrates can be used for semiconductor thin film epitaxial growth, as well as for hermetic wafer bonding.

However, metal substrates have had relatively limited applications in semiconductor device manufacturing. This limitation is primarily due to the fact that metal substrates typically have inferior surface qualities, including insufficient smoothness and flatness, in comparison with conventional non-metal substrates, such as Si and germanium (Ge) substrates.

Currently, fabricating metal substrates typically requires using one or more polishing techniques, which include mechanical polishing, chemical polishing, electric polishing, or a combination of the above. For example, U.S. Pat. No. 6,867,447 discloses a method for preparing a metal substrate surface using electromechanical polishing, and PCT/US2002/041453 describes a technique for polishing metal substrate using a chemical-mechanical polishing (CMP) process. Unfortunately, because of the plasticity and ductility associated with metallic materials, it is extremely difficult to adequately polish these metal substrates using the existing polishing techniques to achieve the technical specifications equivalent to those of Si or Ge substrates. Moreover, these metal-polishing techniques suffer from greater complexity, lack of repeatability, higher cost, and are prone to causing contamination on the polished metal surfaces.

Another serious disadvantage associated with polished metal substrates relates to a general lack of crystalline structure of bulk metal materials. Metal substrates are typically obtained from cutting smelted bulk metallic materials into thin slices and polishing them. However, these bulk metallic materials are comprised of predominately microscopic polycrystals which have random crystalline orientations. Hence, the resulting surfaces do not have a well-defined crystalline orientation and are unsuitable for epitaxial growth of semiconductor structures, even if these substrates have perfectly polished surfaces.

Hence, what is needed is a method and an apparatus for preparing high-quality metal substrates suitable for fabricating semiconductor structures without the above-described problems.

SUMMARY

One embodiment of the present invention provides a method for fabricating a high-quality metal substrate. During operation, the method involves cleaning a polished single-crystal substrate. A metal structure of a predetermined thickness is then formed on a polished surface of the single-crystal substrate. The method further involves removing the single-crystal substrate from the metal structure without damaging the metal structure to obtain the high-quality metal substrate, wherein one surface of the metal substrate is a high-quality metal surface which preserves the smoothness and flatness of the polished surface of the single-crystal substrate.

In a variation of this embodiment, the metal substrate comprises at least one unpolished high-quality metal surface and the unpolished high-quality metal surface inherits a preferred crystalline orientation of the polished surface of the single-crystal substrate.

In a variation of this embodiment, forming the metal structure involves depositing a single-element metal or an alloy.

In a variation of this embodiment, forming the metal structure involves: depositing multiple layers of single-element metals; depositing multiple layers of alloys; or depositing a combination of single-element metals layers and alloy layers.

In a variation of this embodiment, the metal structure has the following properties: a thickness not less than 10 µm; a surface-crystal-axis deviation angle not greater than 3°; a surface roughness not greater than 200 nm; a surface flatness not greater than 2 µm; and a radius of curvature not less than 0.5 m.

In a variation of this embodiment, removing the single-crystal substrate from the metal structure to obtain the metal substrate involves selectively etching away the single-crystal substrate without etching the metal structure.

In a further variation of this embodiment, selectively etching away the single-crystal substrate involves using a chemical etching process.

In a variation of this embodiment, forming the metal structure on the polished surface of the single-crystal substrate involves using one or more of the following techniques: multi-arc ion deposition; radio-frequency (RF) magnetron sputtering deposition; direct-current (DC) magnetron sputtering deposition; ion beam sputtering deposition; electron-beam evaporation; thermal resistive evaporation; and electroplating.

In a variation of this embodiment, the single-crystal substrate is one of the following substrates with one or two polished surfaces: a silicon (Si) single-crystal substrate; a germanium (Ge) single-crystal substrate; a gallium arsenide (GaAs) single-crystal substrate; a gallium phosphide (GaP) single-crystal substrate; an indium phosphide (InP) single-crystal substrate; or any other semiconductor thin film epitaxial substrate.

In a variation of this embodiment, forming the metal structure involves depositing one or more single-element metals or alloys, thereby giving the metal structure a predetermined thermal expansion coefficient.

In a variation of this embodiment, the method involves patterning a raised wall-structure of a predetermined height on the polished surface of the single-crystal substrate prior to forming the metal structure, thereby allowing the resulting concave imprint of the wall-structure to divide the metal surface into isolated flat regions.

In a variation of this embodiment, the method involves etching a patterned trench-structure of a predetermined depth into the polished surface of the single-crystal substrate prior to forming the metal structure, thereby allowing the resulting raised wall-structure which coincides with the patterned trench-structure on the single-crystal substrate to divide the metal surface into isolated flat regions.

Another embodiment of the present invention provides a method for fabricating a high-quality composite metal-semiconductor substrate. During operation, the method involves cleaning a polished single-crystal substrate. A thin semiconductor layer is then deposited on the polished surface of the single-crystal substrate. The method further involves forming a metal structure of a predetermined thickness on the thin semiconductor layer. The single-crystal substrate is then removed from the thin semiconductor layer to obtain the composite metal-semiconductor substrate, wherein one surface of the composite metal-semiconductor substrate is a semiconductor surface.

In a variation of this embodiment, forming the metal structure involves depositing a single-element metal or an alloy.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

Metals and metal alloys typically have good thermal and electrical conducting capabilities. Hence, using metals or alloys as substrate materials for epitaxial growth of semiconductor devices can improve certain properties of these semiconductor devices. However, metal substrates suffer from technical complexity during surface polishing and non-uniformity in surface crystalline orientation, and therefore could not achieve the same level of surface quality as on silicon (Si), germanium (Ge), gallium arsenide (GaAs), and other common wafer substrates.

Embodiments of the present invention provide a method for fabricating high-quality metal substrate surfaces without the need for polishing metallic surfaces. Specifically, a metal structure of a predetermined thickness is deposited on a conventional substrate, such as a Si substrate. This sacrificial conventional substrate is subsequently removed from the metallic layer by using a chemical etching process. Consequently, the original interface between the sacrificial substrate and the metal structure becomes a surface of a stand-alone metal substrate. This surface has substantially the same surface roughness and flatness of the original epitaxial surface. Moreover, this metal surface inherits the crystalline orientation of the original epitaxial surface. The described fabrication process can be performed in a simple and low-cost manner. Furthermore, this high-quality metal surface does not require any polishing.

Description of the Metal Substrate Deposition System

Figure 1:
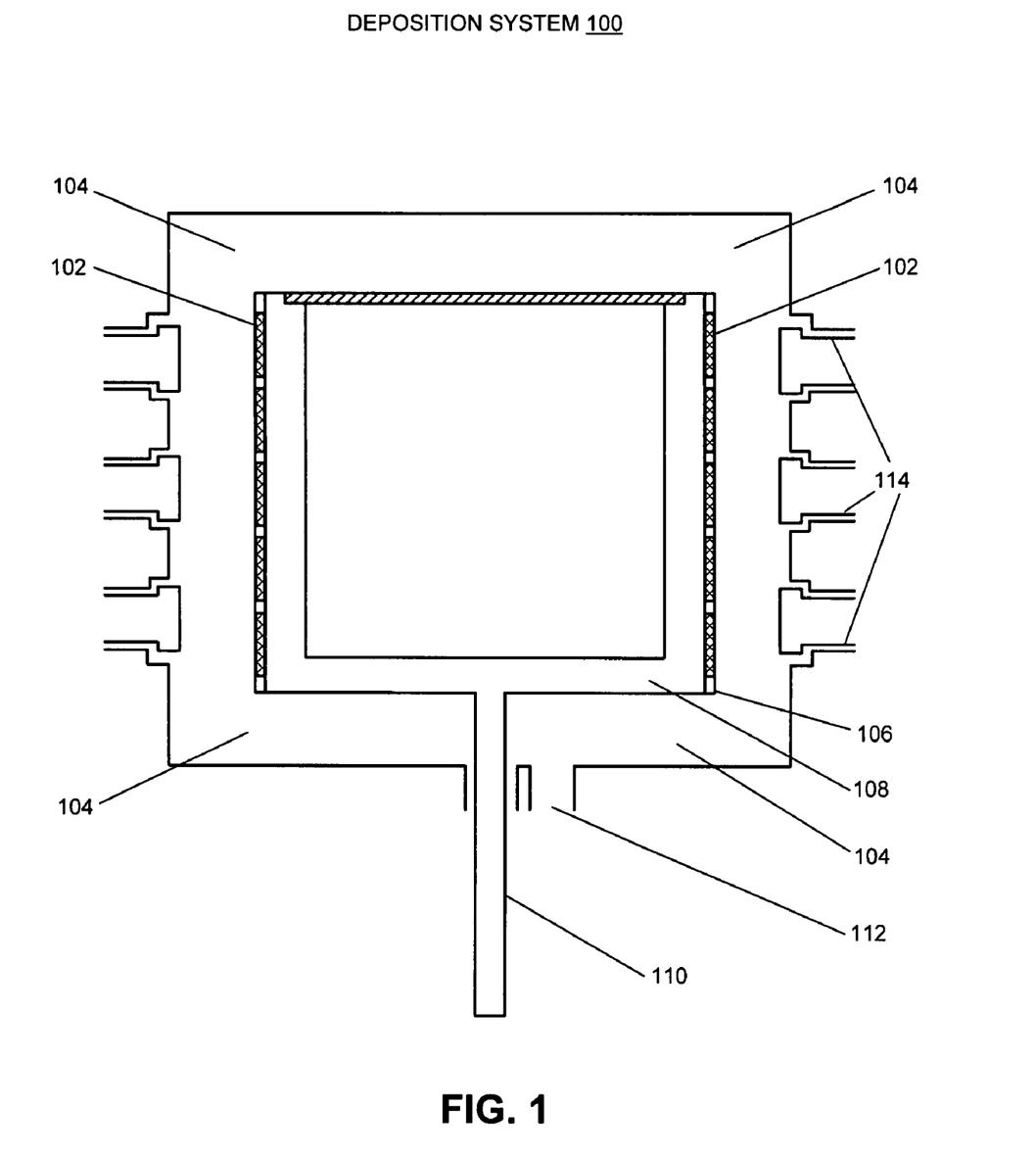
FIG. 1 illustrates the cross-sectional view of the metal deposition system for fabricating the metal substrate in accordance with one embodiment of the present invention.

FIG. 1 illustrates the cross-sectional view of the metal deposition system 100 for fabricating the metal substrate in accordance with one embodiment of the present invention.

A number of epitaxial substrates 102 are placed inside a vacuum chamber 104 of a deposition system 100. Epitaxial substrates 102 can include any conventional semiconductor epitaxial substrate, such as Si substrates, Ge substrates, and GaAs substrates.

Epitaxial substrates 102 are firmly held down by substrate fixture 106 so that the substrates will not become lose or fall off during the deposition process. In one embodiment of the present invention, the thickness of substrate fixture 106 is no more than 20 times of the thickness of epitaxial substrates 102. Note that each epitaxial substrate 102 has one or two polished surfaces, and one polished surface is facing outwards toward vacuum chamber 104 and the targets.

Substrate fixture 106 is attached to a rotating substrate table 108. To obtain a uniform layer thickness across epitaxial substrates 102, one embodiment of the present invention uses a speed-adjustable rotation motor to control the motion of rotating substrate table 108.

During a metal deposition process, target materials adhere to the surface of epitaxial substrate 102 and release latent heat while becoming crystallized, which causes the substrate temperature to increase. This substrate heating can cause the metal layer to delaminate, to buckle, or even to peel off from epitaxial substrates 102 due to a possible mismatch of thermal expansion coefficients between epitaxial substrates 102 and the metal layer.

To prevent this phenomenon from occurring, rotating substrate table 108 is constructed into a hermetically sealed hollow structure. In one embodiment of the present invention, cooling water is pumped into the hollow structure of rotating substrate table 108, which constantly removes heat from epitaxial substrates 102 and the space around epitaxial substrates 102 where the heat is dissipated. More specifically, the cooling water is flowed into and out-off rotating substrate table 108 through a rotation axis 110 of rotating substrate table 108, wherein rotation axis 110 is coupled into vacuum chamber 104 through a motion-sealed feedthrough mechanism. Both the inlet and the outlet of the cooling water are contained inside rotation axis 110, and are isolated using a motion-sealed apparatus. Furthermore, the cooling water itself is isolated from both the inside and outside of vacuum chamber 104 using a motion-sealed mechanism.

In one embodiment of the present invention, the exterior of rotating substrate table 108 has a multi-facet column geometry. Each of the facets is polished to a certain degree of flatness and smoothness, which facilitates uniform heat dissipation from epitaxial substrates 102 during the deposition process. Moreover, the polished external surfaces of rotating substrate table 108 allows epitaxial substrates 102 to be firmly cleaved to rotating substrate table 108 as is illustrated in FIG. 1.

To obtain a vacuum condition inside vacuum chamber 104, vacuum chamber 104 is connected to an external vacuum pump system through pump interface 112. Note that the vacuum pump system used in this invention can be one of: a cascade molecular pump-mechanical pump system, a cascade dispersion pump-mechanical pump system, or a cascade molecular pump/dispersion pump-dry pump system.

Deposition targets 114 are mechanically attached to but electrically insulated from the inner wall of vacuum chamber 104. Each of deposition targets 114 can be comprised of either a single element metal material or an alloy. The distant between deposition targets 114 and epitaxial substrates 102 is sufficient large so that both charged and uncharged atoms sputtered off deposition targets 114 can travel a sufficient long dispersion-length before reaching epitaxial substrates 102, thereby facilitating forming a uniform layer of the deposited metal material. Note that two or more deposition targets 114 can be arranged uniformly on the inner wall of vacuum chamber 104, and used simultaneously during the deposition process. Also note that deposition targets 114 can be water-cooled during the deposition. In addition, any other metal deposition system or method can be used.

Process of Metal Substrate Deposition

Figure 2:
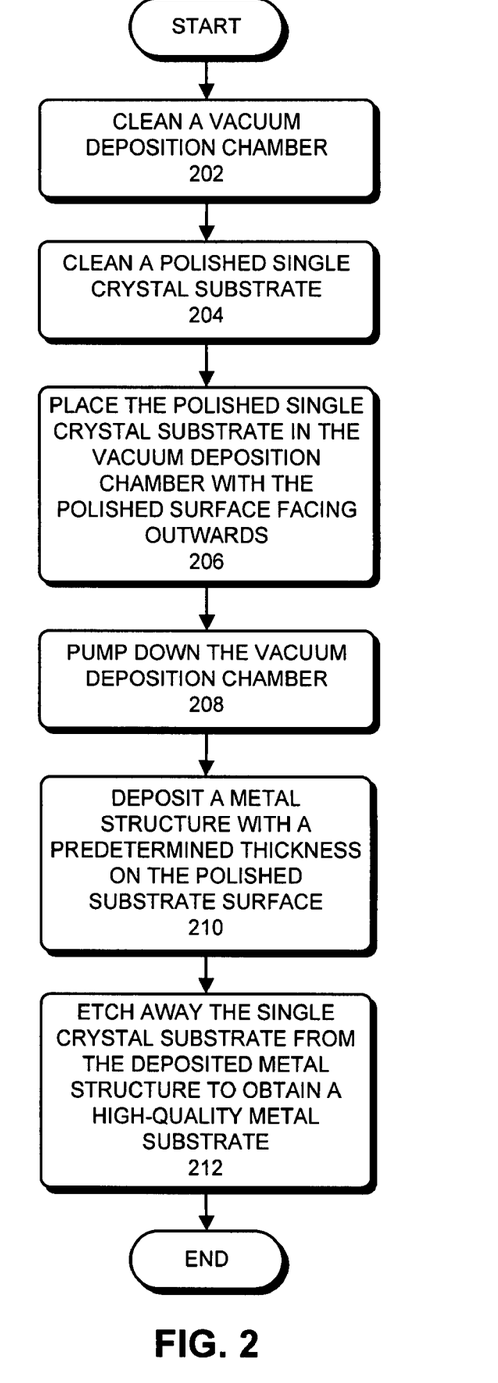
FIG. 2 presents a flowchart illustrating the process of fabricating the metal substrate in accordance with one embodiment of the present invention.

FIG. 2 presents a flowchart illustrating the process of fabricating the metal substrate in accordance with one embodiment of the present invention.

The process starts with cleaning the vacuum deposition chamber to remove sources of contamination (step 202).

Next, a single-side or double-side-polished single-crystal substrate is cleaned. This substrate material can include but is not limited to: single-crystal Si, single-crystal Ge, single-crystal gallium arsenide (GaAs), single-crystal gallium phosphide (GaP), single-crystal indium phosphide (InP), or any other semiconductor thin film epitaxial substrate (step 204). In one embodiment of the present invention, cleaning the substrate involves immersing the substrate in a hot bath. In a further embodiment, cleaning the substrate involves using an ultrasonic bath.

The cleaned single-crystal substrate is then placed in the vacuum deposition chamber with one polished surface facing the vacuum chamber (step 206). The vacuum chamber is pumped down to a vacuum condition suitable for metal deposition (step 208).

Next, the process involves depositing a metal structure of a predetermined thickness on the polished substrate surface (step 210). Note that the metal structure can be deposited on the polished substrate surface using one or more of the following techniques: multi-arc ion deposition; radio-frequency (RF) magnetron sputtering deposition; direct-current (DC) magnetron sputtering deposition; ion beam sputtering deposition; electron beam evaporation; thermal resistive evaporation; and electroplating. In one embodiment of the present invention, the process can use a combination of the above techniques. For example, the process can first deposit a relatively thin single metal layer or alloy layer inside an electron-beam evaporation system. The process then deposits one or more thicker metal layers using a multi-arc ion deposition system.

In one embodiment of the present invention, the metal structure can have a predetermined thermal expansion coefficient. This can be achieved by choosing a suitable combination of materials (e.g., single element metals, alloys), number of layers, layer thickness, and other parameters.

Figure 3A:
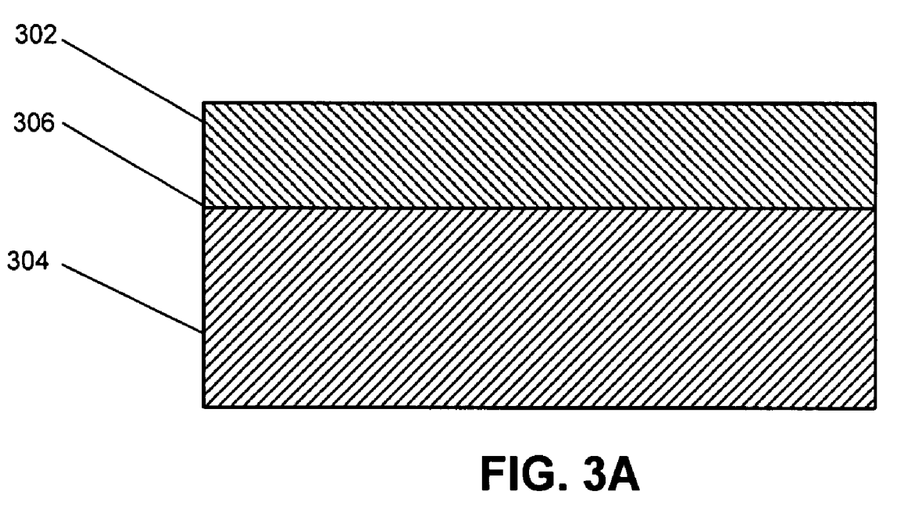
FIG. 3A illustrates a cross-sectional view of a metal structure formed on a single-crystal substrate after the deposition process in accordance with one embodiment of the present invention.

FIG. 3A illustrates a cross-sectional view of a metal structure 302 formed on a single-crystal substrate 304 after the deposition process in accordance with one embodiment of the present invention. Note that metallic structure 302 can comprise a single layer of a pure metal element (for example, a pure Al layer or Ag layer), a single alloy layer (for example, a Cr/Pt layer), or a multilayer stack of a combination of the above. Moreover, a thin metallic interface-layer 306, which is adjacent to the polished surface of single-crystal substrate 304, inherits a preferred crystalline orientation of the polished surface. This metallic interface layer 306 is typically less than 0.2 μm thick.

Figure 3B:
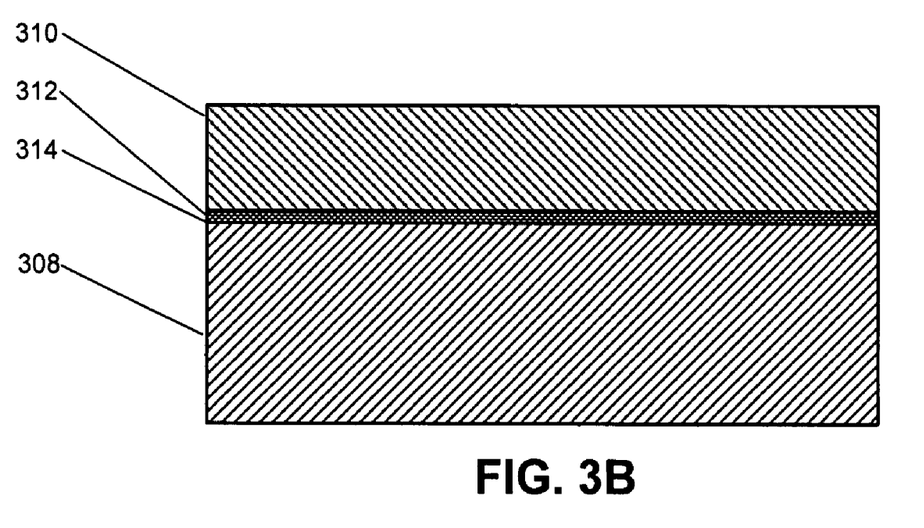
FIG. 3B illustrates a cross-sectional view of a metal structure formed on a single-crystal substrate which is pre-deposited with a semiconductor transition layer in accordance with one embodiment of the present invention.

In one embodiment of the present invention, prior to forming metal structure 302 on single-crystal substrate 304, the process involves growing first a thin semiconductor layer directly onto the polished surface of single-crystal substrate 304, so that the thin semiconductor layer inherits a preferred crystalline orientation of the single-crystal substrate 304. FIG. 3B illustrates a cross-sectional view of a metal structure 310 formed on a single-crystal substrate 308 which is pre-deposited with a semiconductor transition layer 312 in accordance with one embodiment of the present invention. Semiconductor transition layer 312 can be any semiconductor material used in a semiconductor device that can be epitaxially grown onto substrate 308. For example, semiconductor transition layer 312 can be a GaN layer, or a AlGaN layer.

Note that the thickness of semiconductor transition layer 312 is typically between 20 angstroms to 0.2 μm. Note that an interfacial layer 314 is a very thin semiconductor layer between single-crystal substrate 304 and semiconductor transition layer 312, which inherits the preferred crystalline orientation of single-crystal substrate 304.

Referring back to FIG. 2, the process next involves removing the sacrificial single-crystal substrate from the deposited metal structure to obtain a metal substrate (step 212). In one embodiment, removing the single-crystal substrate involves a chemical etching process, which can be a wet-etching process, or a gas-phase etching process. Ideally, the etching process removes the single-crystal substrate uniformly from the metal structure without etching the metal structure. This can be achieved by choosing a high selectivity enchant and stopping the etching process immediately when the single-crystal substrate is completely removed.

After removing the sacrificial single-crystal substrate, the remaining metal substrate inherits at least one high-quality surface which preserves the smoothness and flatness of the original polished surface of the single-crystal substrate. The other surface of the metal substrate can be polished if necessary by using a conventional chemical-mechanical polishing or a chemical-electrical polishing technique.

In one embodiment of the present invention, the obtained metal substrate has a diameter of at least 20 mm, a thickness of at least 10 μm, a radius of curvature of at least 0.5 m, a surface roughness not greater than 200 nm, a surface flatness not greater than 2 μm, and a surface-crystal-axis deviation angle not greater than 3°.

Figure 4A:
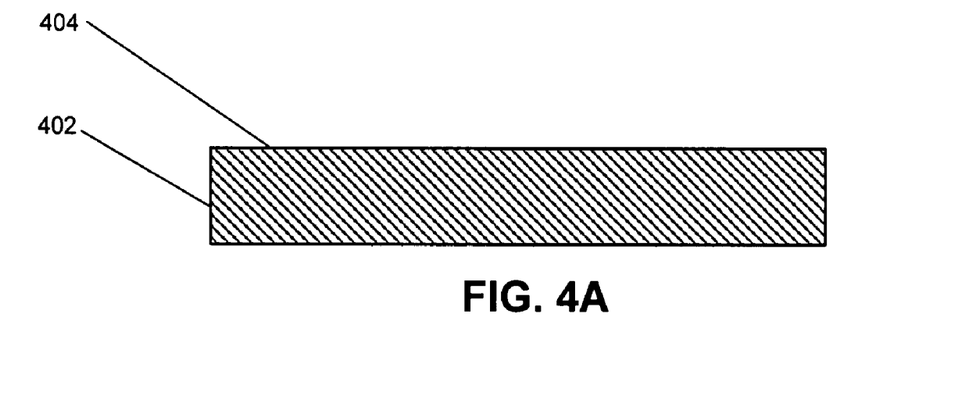
FIG. 4A illustrates a cross-sectional view of a metal substrate obtained after removing the single-crystal substrate in FIG. 3A in accordance with one embodiment of the present invention.

FIG. 4A illustrates a cross-sectional view of a metal substrate 402 obtained after removing single-crystal substrate 304 in FIG. 3A in accordance with one embodiment of the present invention. Note that interface layer 306 in FIG. 3A becomes surface 404 of metal substrate 402. In addition to inheriting the preferred crystalline orientation of the original substrate, surface 404 also preserves the smoothness and flatness of the original polished surface. As a result, metal substrate 402 can be used as a substrate without polishing.

Figure 4B:
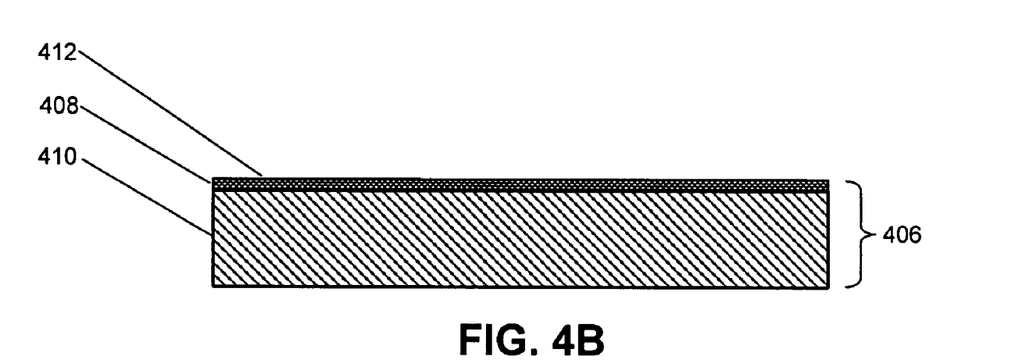
FIG. 4B illustrates a cross-sectional view of a composite metal-semiconductor substrate obtained after removing the single-crystal substrate in FIG. 3B in accordance with one embodiment of the present invention.

Similarly, FIG. 4B illustrates a cross-sectional view of a composite metal-semiconductor substrate 406 obtained after removing single-crystal substrate 308 in FIG. 3B in accordance with one embodiment of the present invention. Note that composite metal-semiconductor substrate 406 includes a thin semiconductor transition layer 408 and a metal structure 410. Interfacial layer 314 in FIG. 3B becomes surface 412 of composite metal-semiconductor substrate 406. In addition to inheriting the preferred crystalline orientation of the original substrate, surface 412 also preserves the smoothness and flatness of the original polished surface. As a result, composite metal-semiconductor substrate 406 can be used as a substrate without polishing. Note that when we use composite metal-semiconductor substrate 406 to fabricate semiconductor devices, semiconductor transition layer 408 becomes a seed layer to subsequent growth of semiconductor layers.

Note that the metal substrate of the present invention can comprise multiple layers of single-metal elements, multiple layers of alloys, or a stack of mixed single-metal-element-layers and alloy layers. For this multilayer substrate structure, a thin surface layer ($\geq$100 angstrom) ideally has a preferred orientation and a compact texture. The thermal expansion coefficients between the multiple layers can be identical or different. However, as mentioned above, the metal substrate can also have a designed overall thermal expansion coefficient.

EXEMPLARY APPLICATIONS

Example 1

Referring to FIGS. 1, 3A, and 4A, one starts with cleaning a polished Si substrate 304. Cleaned Si substrate 304 is then transferred into vacuum chamber 104 of deposition system 100. Specifically, substrate 304 is placed onto rotating substrate table 108 and clamped down tightly using substrate fixture 106. The polished side of the substrate is facing outwards and the backside of the substrate is cleaved to the surface of rotating substrate table 108. One half of deposition targets 114 comprise pure Chromium (Cr) targets and the other half are 316 stainless-steel targets. These targets have a spatial arrangement to facilitate forming layers with uniform thickness and composition. Deposition system 100 is equipped with a multi-arc ion deposition power supply, which further includes a bias voltage source, and an arc power supply.

The system is then pumped down to vacuum. When the chamber pressure is below $8 \times 10^{-3}$ Pa, Argon (Ar) gas is flowed into the chamber, and a chamber pressure of 0.5 Pa is maintained. Next, a pure Cr layer with a thickness greater than 100 angstrom is deposited on Si substrate 304. Note that this Cr layer inherits a preferred orientation from the Si substrate surface. Subsequently, pure Cr and 316L stainless-steel are simultaneously deposited to form a layer of Cr/316L stainless-steel alloy. Specifically, during the alloy deposition process, the deposition conditions is controlled so that the alloy layer adjacent to the pure Cr layer has a relatively lower density, and the layer density is gradually increased as the layer thickness increases.

Upon completion of the metal structure deposition, the substrate is removed from deposition system 100. Next, original Si substrate 304 is etched away using a common Si etchant, for example, a nitric acid ($NHO_3$) or a hydrofluoric acid (HF) and acetic acid (AcOH) mixture. A high-quality metal substrate 402 is then obtained. Metal substrate 402 has the same surface roughness and flatness of those of original Si substrate 304, and therefore does not require polishing. Furthermore, the surface of metal substrate 402 is the Cr layer with the preferred orientation.

Example 2

Referring to FIGS. 1, 3A, and 4A, one first receives a number of cleaned semiconductor epitaxial substrates, which can include Si substrates, Ge substrates, GaAs substrates, or other common epitaxial substrates. A platinum (Pt) layer with a thickness greater than 100 angstrom is deposited on the polished surfaces of these substrates. Next, these substrates are placed and secured on rotating substrate table 108 in deposition system 100. The Pt surfaces of the substrates are facing outwards while the backsides of the substrates are cleaved to the surface of rotating substrate table 108. One half of deposition targets 114 comprise pure Cr targets and the other half are 316 stainless-steel targets. These targets have a spatial arrangement to facilitate forming layers with uniform thickness and composition. Deposition system 100 is equipped with a multi-arc ion deposition power supply, which further includes a bias voltage source, and an arc power supply.

The system is then pumped down to vacuum. When the chamber pressure is below $8\times10^{-3}$ Pa, a flow of Ar gas is injected into the chamber, and the chamber pressure is maintained at 0.5 Pa. Next, pure Cr and 316L stainless-steel are simultaneously deposited to form a layer of Cr/316L stainless-steel alloy, while the temperature inside vacuum chamber 104 is maintained below 400° F. through water-cooling. Note that during the alloy deposition process, if all processing parameters are maintained, the alloy layer adjacent to the pure Pt layer tends to be relatively more compacted. However, as the alloy layer thickness increases, the alloy layer gradually decreases in compactness. To prevent the metal structure from buckling up upon removing the original substrates due to different thermal expansions within the metal structure, the amount of 316L stainless-steel in the alloy can be intentionally increased as the alloy layer becomes thicker. This technique can compensate for the thermal expansion issue due to the changing alloy compactness, thereby facilitating formation of a flat metal substrate.

Upon completion of deposition of metal layer 302, the substrates are removed from deposition system 100. Next, the original substrates are etched away using a commonly-used substrate etchant to obtain a number of high-quality metal substrates 402. Metal substrates 402 have the same surface roughness and flatness of those of the original substrates, and therefore do not require polishing. Furthermore, metal substrates 402 are composite metal substrates comprising a pure Pt surface layer.

Example 3

Referring to FIGS. 1, 3B, and 4B, one starts with cleaning a number of Si substrates 304 which have been deposited with a semiconductor layer 312. These substrates are then placed and secured on rotating substrate table 108 in deposition system 100. The semiconductor-layer surfaces of the substrates are facing outwards while the backsides of the substrates are cleaved to the surface of rotating substrate table 108. One half of deposition targets 114 comprise pure Cr targets and the other half are 316 stainless-steel targets. These targets have a spatial arrangement to facilitate forming layers with uniform thickness and composition. Note that deposition system 100 is equipped with a DC magnetron sputtering deposition power supply.

Next, the system is pumped down to vacuum. When the chamber pressure is below $8\times10^{-3}$ Pa, an Ar gas flow is injected into the chamber, and the chamber pressure is maintained at 0.5 Pa. Next, pure Cr and 316L stainless-steel are simultaneously deposited to form a layer of Cr/316L stainless-steel alloy 310, while the temperature inside vacuum chamber 104 is maintained below 400° F. through water-cooling. Note that during the alloy deposition process, if all processing parameters are maintained, the alloy layer adjacent to semiconductor layer 312 tends to be relatively more compacted. However, as the alloy layer thickness increases, the alloy layer gradually decreases in compactness. To prevent the metal structure from buckling up upon removing the original substrates (due to different thermal expansions within the metal structure), the amount of 316L stainless-steel in the alloy can be intentionally increased as the alloy layer 310 becomes thicker. This technique can compensate for the thermal expansion issue due to the changing alloy compactness, thereby facilitating formation of a flat metal substrate.

The deposition process is stopped when the thickness of alloy layer 310 reaches 80 µm. The substrate is then removed from deposition system 100. Next, original Si substrates 304 is etched away using a Si etchant (this etchant does not etch semiconductor layer 312 and metal structure 310) to obtain a number of high-quality metal substrates 406. Metal substrates 406 have the same surface roughness and flatness of those of original Si substrates 304, and therefore do not need polishing. Furthermore, metal substrates 406 are composite substrates comprising a semiconductor surface layer 408.

Variations on the Metal Substrate Structure

Metal Substrate with Concave Imprint

Figure 5A:
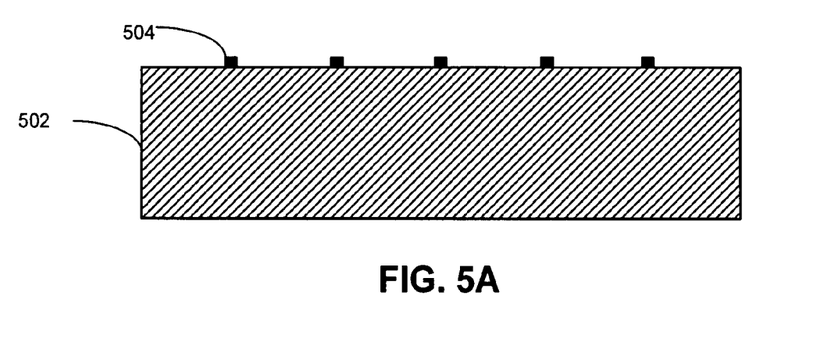
FIG. 5A illustrates a cross-sectional view of a patterned wall-structure on a polished single-crystal substrate in accordance with one embodiment of the present invention.
Figure 5B:
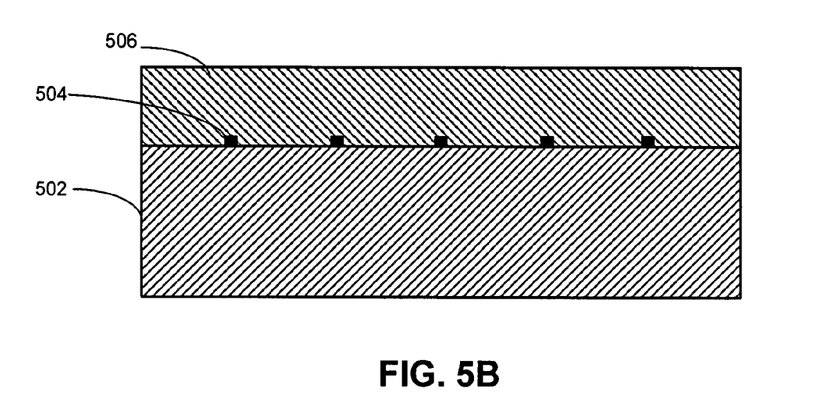
FIG. 5B illustrates a cross-sectional view of a metal structure deposited on the patterned single-crystal substrate in accordance with one embodiment of the present invention.
Figure 5C:
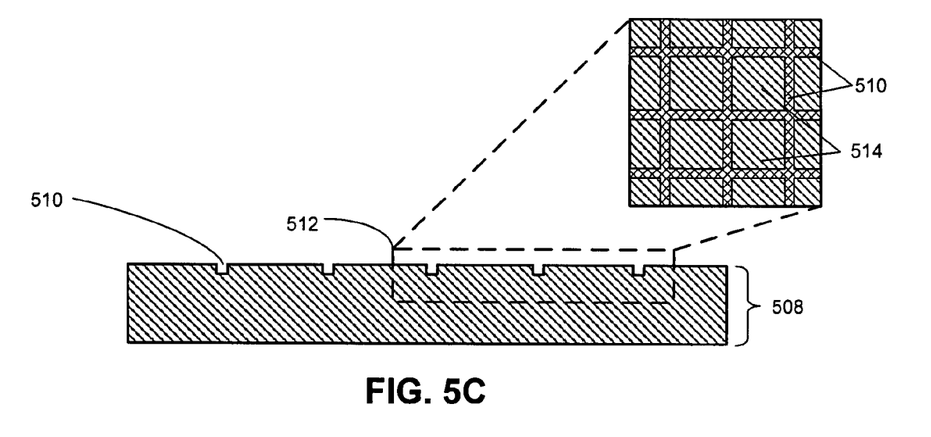
FIG. 5C illustrates a cross-sectional view of a stand-alone metal substrate imprinted with the concave wall-structure in accordance with one embodiment of the present invention.

FIGS. 5A-5C illustrate the process of fabricating a patterned metal substrate in accordance with one embodiment of the present invention.

FIG. 5A illustrates a cross-sectional view of a patterned wall-structure on a polished single-crystal substrate in accordance with one embodiment of the present invention. The process starts with receiving a single-crystal substrate 502, for example, a Si substrate. Next, a patterned structure 504 is fabricated on single-crystal substrate 502. In one embodiment of the present invention, fabricating patterned structure 504 on single-crystal substrate 502 involves using a photomask with design patterns and a photolithography process.

FIG. 5B illustrates a cross-sectional view of metal structure 506 deposited on the patterned single-crystal substrate of FIG. 5A in accordance with one embodiment of the present invention. Note that metal structure 506 is formed on patterned structure 504 using the above-described techniques.

FIG. 5C illustrates a cross-sectional view of a stand-alone metal substrate imprinted with the concave wall-structure in accordance with one embodiment of the present invention. Similar to the above-described techniques to obtain a metal substrate, the process etches away both single-crystal substrate 502 and patterned structure 504 to obtain a patterned metal substrate 508. Because patterned structure 504 was a raised structure on single-crystal substrate 502, it is transferred onto metal substrate 508 as a concave structure 510. Note that individual regions between the concave structure 510 on the surface of metal substrate 508 inherit the polished quality of single-crystal substrate 502, hence the surface of metal substrate 508 does not need to be polished. Furthermore, the material used for patterned structure 504 ideally is easily etchable without causing damage to the patterned and unpatterned surface of metal substrate 508. In one embodiment, this material is Titanium (Ti) or Nickel (Ni).

Note that this process creates a concaved structure on a metal substrate without the additional patterning and etching of the metal substrate. This is critically important for obtaining the high-quality surface of metal substrate 508.

The inset of FIG. 5C illustrates a top view of an area 512 on the surface of metal substrate 508. In this embodiment, a patterned mesh-structure 510 divides the surface of metal substrate 508 into isolated square islands 514 of a predetermined surface area. In one embodiment, the predetermined surface area is at least 150 µm×150 µm to retain a sufficient flatness. Note that patterned structure 504 is not limited to mesh-structure 510.

Exemplary Application of the Above Variation

Referring to FIGS. 5A-5C, in one embodiment of the present invention, some Si substrates are first received. A layer of etchable metal (e.g., Ti, Ni, etc.) with a thickness between 2 µm to 40 µm is then deposited on a polished surface of the substrates. Next, the metal layer is patterned and wet-etched to obtain a patterned structure 504, wherein the height of structure 504 is between 2 µm to 40 µm, and the width of structure 504 is between 2 µm to 1000 µm. Patterned structure 504 can include a mesh-structure, a diamond-structure, and a line-structure.

Next, a metal layer 506 with a thickness of 60 μm to 400 μm is deposited, wherein the deposition is performed in the system of FIG. 1. Metal layer 506 is a Cr-based etch-resistant alloy. Both the Si substrate and patterned structure 504 are then etched away using a wet etchant which does not interact with the Cr-based alloy. The remaining metal layer 506 becomes metal substrate 508.

Metal Substrate with Raised Wall-Structure

Figure 6A:
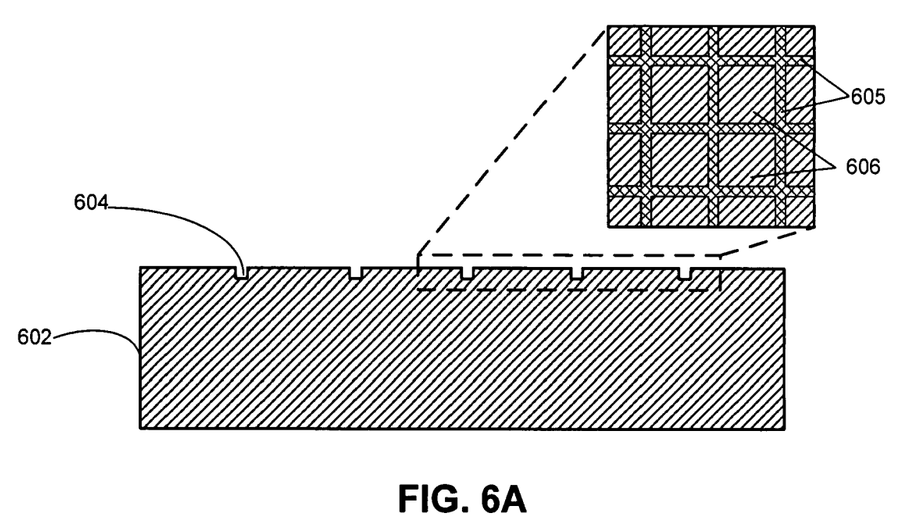
FIG. 6A illustrates a cross-sectional view of a single-crystal substrate with a patterned trench-divided surface in accordance with one embodiment of the present invention.
Figure 6B:
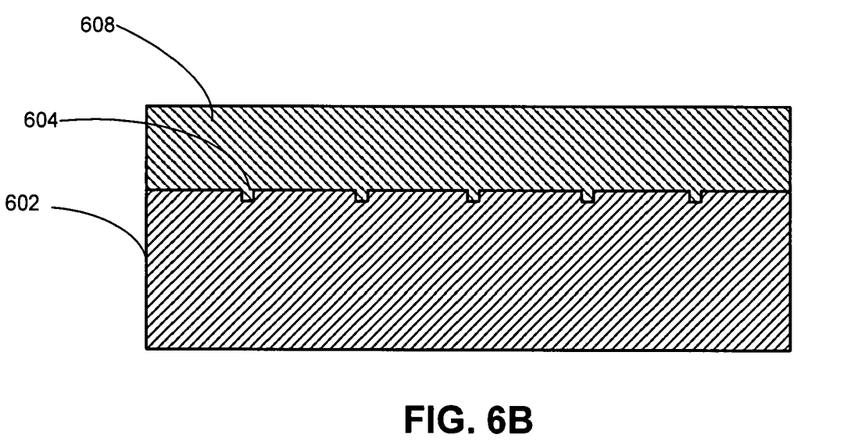
FIG. 6B illustrates a cross-sectional view of a metal structure deposited on the patterned single-crystal substrate in accordance with one embodiment of the present invention.
Figure 6C:
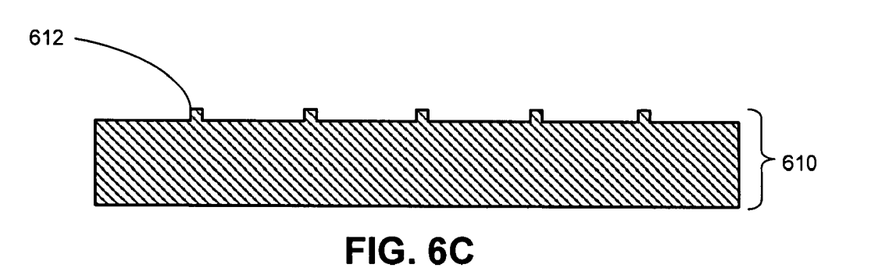
FIG. 6C illustrates a cross-sectional view of a stand-alone metal substrate with a patterned wall-structure on the surface in accordance with one embodiment of the present invention.

FIGS. 6A-6C illustrate the process of fabricating a structured metal substrate from a patterned single-crystal substrate in accordance with one embodiment of the present invention.

FIG. 6A illustrates a cross-sectional view of a single-crystal substrate 602 with a patterned trench-divided surface in accordance with one embodiment of the present invention. The process starts with receiving polished single-crystal substrate 602, for example, a Si substrate. Next, a patterned structure 604 is fabricated on a polished surface of single-crystal substrate 602. In one embodiment of the present invention, patterned structure 604 is a mesh-structure 605 illustrated in the inset of FIG. 6A. This trench-structure divides the original polished surface into many flat regions 606. In one embodiment of the present invention, fabricating patterned structure 604 involves using a photolithography process and a substrate etching process.

FIG. 6B illustrates a cross-sectional view of a metal structure 608 deposited on the patterned single-crystal substrate of FIG. 6A in accordance with one embodiment of the present invention.

FIG. 6C illustrates a cross-sectional view of a stand-alone metal substrate 610 with a patterned wall-structure on the surface in accordance with one embodiment of the present invention. Similar to above-described techniques to obtain a stand-alone metal substrate, single-crystal substrate 602 is etched away to obtain patterned metal substrate 610. Because patterned structure 604 is imprinted into single-crystal substrate 602, it is transferred onto metal substrate 610 as a raised wall-structure 612. Note that regions between the raised walls on the surface of metal substrate 610 inherit the polished quality of single-crystal substrate 602, hence the surface of metal substrate 610 does not need to be polished. Additionally, raised wall-structure 612 divides the surface of metal substrate 610 into multiple flat regions with a predetermined surface area. In one embodiment, the predetermined surface area is at least 150 μm×150 μm to retain a sufficient flatness.

The described process creates a raised wall-structure on a metal substrate without the additional patterning and etching of a material different from the substrate material. This guarantees that the metal substrate and the raise structure have identical thermal expansion coefficients.

Exemplary Application of the Above Variation

Referring to FIGS. 6A-6C, in one embodiment of the present invention, some Si substrates with at least one polished surface are first received. Trench-structure 604 is then fabricated on one polished surface of the Si substrate. Note that trench-structure 604 divides the Si substrate surface into many isolated flat regions, which have a surface area greater than 100 μm×100 μm. Note that trench-structure 604 can include a mesh-structure, a diamond-structure, and a line-structure.

Next, metal layer 608 with a thickness of 60 μm to 400 μm is deposited on the patterned Si substrate surface, wherein the deposition is performed in the system of FIG. 1. Metal layer 608 is a Cr-based etch-resistant alloy. The Si substrate is then etched away using a wet Si-etchant which does not interact with the Cr-based alloy. The remaining metal layer 608 becomes metal substrate 610, which has a substrate surface that does not need polishing.

Composite Metal-Semiconductor Substrate with Raised Wall-Structure

Figure 7A:
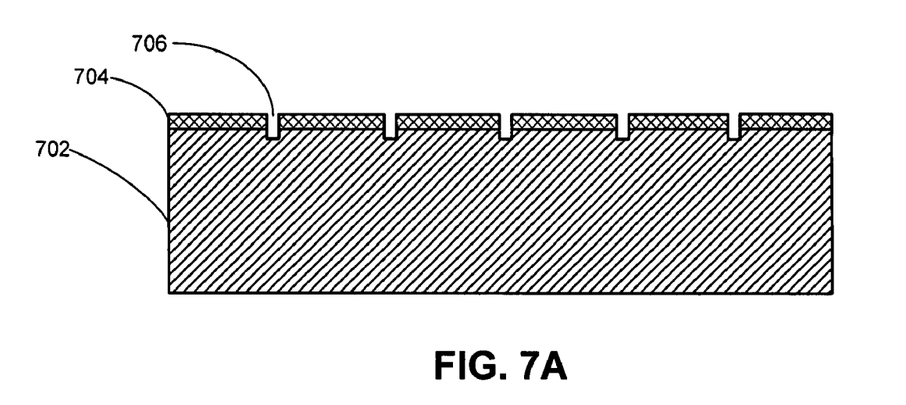
FIG. 7A illustrates a cross-sectional view of a single-crystal substrate with a patterned trench-divided surface and a semiconductor layer in accordance with one embodiment of the present invention.
Figure 7B:
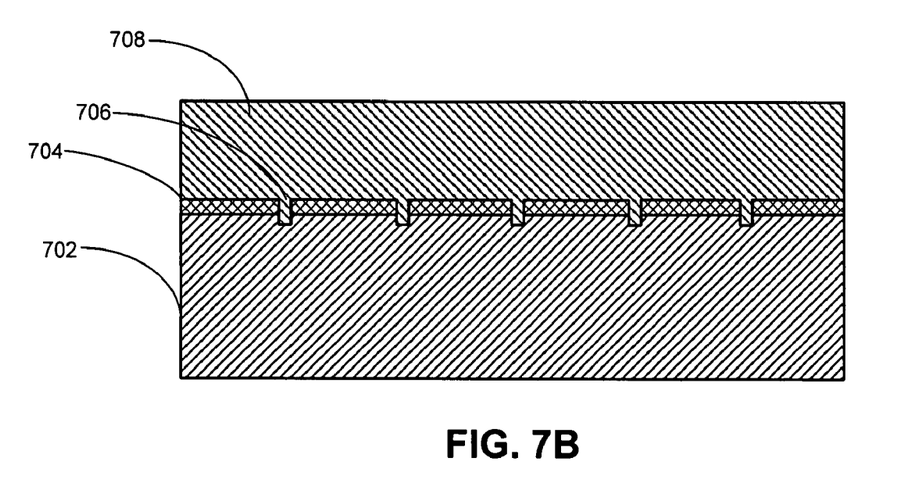
FIG. 7B illustrates a cross-sectional view of a metal structure deposited on the trench-divided surface of the semiconductor layer in accordance with one embodiment of the present invention.
Figure 7C:
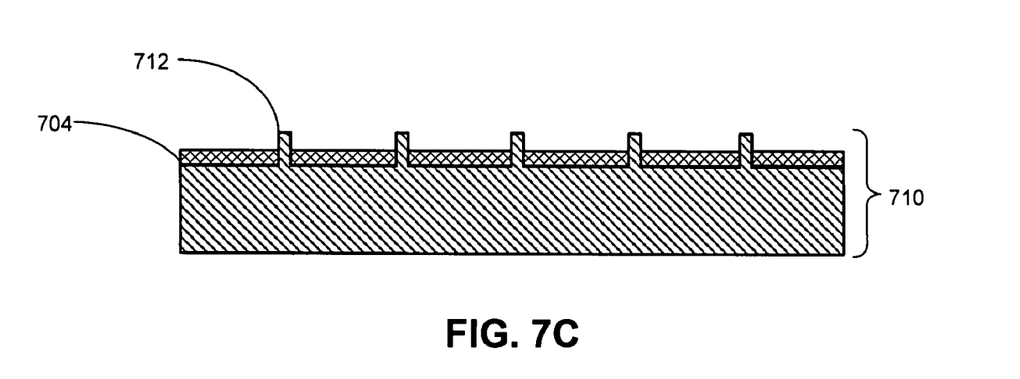
FIG. 7C illustrates a cross-sectional view of a composite metal-semiconductor substrate with a patterned wall-structure and a semiconductor surface layer in accordance with one embodiment of the present invention.

FIGS. 7A-7C illustrate the process of fabricating a patterned composite metal-semiconductor substrate from a patterned single-crystal substrate in accordance with one embodiment of the present invention.

FIG. 7A illustrates a cross-sectional view of a single-crystal substrate 702 with a patterned trench-divided surface and a semiconductor layer in accordance with one embodiment of the present invention. The process starts with receiving a single-crystal substrate 702 with a patterned surface as illustrated in FIG. 6A. Next, a patterned semiconductor layer 704 is fabricated wherein patterned trench-structure 706 in semiconductor layer 704 coincides with the patterns in single-crystal-substrate 702. Note that trench-structure 706 divides semiconductor layer 704 into many isolated flat regions.

FIG. 7B illustrates a cross-sectional view of a metal structure 708 deposited on the trench-divided surface of semiconductor layer 704 in accordance with one embodiment of the present invention.

FIG. 7C illustrates a cross-sectional view of a composite metal-semiconductor substrate 710 with a patterned wall-structure and a semiconductor surface layer in accordance with one embodiment of the present invention. Similar to the above-described techniques to obtain a stand-alone metal substrate, single-crystal substrate 702 is etched away to obtain composite metal-semiconductor substrate 710. Note that raised metal-wall 712 divides semiconductor layer 704 into isolated regions wherein these individual semiconductor surfaces inherit the polished quality of the original single-crystal substrate surface. Hence the surface of composite metal-semiconductor substrate 710 does not need to be polished.

Note that the described process creates a raised wall-structure on a metal substrate without having to additionally pattern and etch a material different from the substrate material. This guarantees that the substrate material and the wall-structure have identical thermal expansion coefficients.

Exemplary Application of the Above Variation

Referring to FIGS. 7A-7C, in one embodiment of the present invention, some Si substrates are first received with built-in trench-structure 706 and an as-deposited semiconductor layer 704 (also patterned) on the patterned substrate surface. Metal layer 708 with a thickness of 60 μm to 400 μm is then deposited on the as-deposited semiconductor layer, wherein the deposition is performed in the system of FIG. 1. The metal layer 708 is a Cr-based etch-resistant alloy. Next, the Si substrate is etched away using a wet Si-etchant. The remaining metal layer 708 becomes metal substrate 710, which is a composite metal-semiconductor substrate. This composite metal-semiconductor substrate has the same surface roughness and flatness as those of the original Si substrate surface. The surface layer of the composite metal-semiconductor substrate is the original semiconductor layer, which is divided by the raised metal-wall 712 into multiple isolated flat regions.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fabricating a high-quality metal substrate, comprising:
   cleaning a polished single-crystal substrate;
   forming a metal structure of a predetermined thickness on a polished surface of the single-crystal substrate; and
   obtaining a high-quality metal substrate by removing the single-crystal substrate from the metal structure without damaging the metal structure;
   wherein one surface of the metal substrate is a high-quality metal surface which preserves the smoothness and flatness of the polished surface of the single-crystal substrate.

2. The method of claim 1,
   wherein the metal substrate comprises at least one unpolished high-quality metal surface; and
   wherein the unpolished high-quality metal surface inherits a preferred crystalline orientation of the polished surface of the single-crystal substrate.

3. The method of claim 1, wherein forming the metal structure involves depositing a single-element metal or an alloy.

4. The method of claim 1, wherein forming the metal structure involves:
   depositing multiple layers of single-element metals;
   depositing multiple layers of alloys; or
   depositing a combination of single-element metals layers and alloy layers.

5. The method of claim 1, wherein the metal structure has the following properties:
   a thickness not less than 10 µm;
   a surface-crystal-axis deviation angle not greater than 3°;
   a surface roughness not greater than 200 nm;
   a surface flatness not greater than 2 µm; and
   a radius of curvature not less than 0.5 m.

6. The method of claim 1, wherein removing the single-crystal substrate from the metal structure to obtain the metal substrate involves selectively etching away the single-crystal substrate without etching the metal structure.

7. The method of claim 6, wherein selectively etching away the single-crystal substrate involves using a chemical etching process.

8. The method of claim 1, wherein forming the metal structure on the polished surface of the single-crystal substrate involves using one or more of the following techniques:
   multi-arc ion deposition;
   radio-frequency (RF) magnetron sputtering deposition;
   direct-current (DC) magnetron sputtering deposition;
   ion beam sputtering deposition;
   electron-beam evaporation;
   thermal resistive evaporation; and
   electroplating.

9. The method of claim 1, wherein the single-crystal substrate is one of the following substrates with one or two polished surfaces:
   a silicon (Si) single-crystal substrate;
   a germanium (Ge) single-crystal substrate;
   a gallium arsenide (GaAs) single-crystal substrate;
   a gallium phosphide (GaP) single-crystal substrate;
   an indium phosphide (InP) single-crystal substrate; or
   any other semiconductor thin film epitaxial substrate.

10. The method of claim 1, wherein forming the metal structure involves depositing one or more single-element metals or alloys, thereby giving the metal structure a predetermined thermal expansion coefficient.

11. The method of claim 1, further comprising patterning a raised wall-structure of a predetermined height on the polished surface of the single-crystal substrate prior to forming the metal structure, thereby allowing the resulting concave imprint of the wall-structure to divide the metal surface into isolated flat regions.

12. The method of claim 1, further comprising etching a patterned trench-structure of a predetermined depth into the polished surface of the single-crystal substrate prior to forming the metal structure, thereby allowing the resulting raised wall-structure which coincides with the patterned trench-structure on the single-crystal substrate to divide the metal surface into isolated flat regions.

13. A method for fabricating a high-quality composite metal-semiconductor substrate, comprising:
   cleaning a polished single-crystal substrate;
   depositing a semiconductor layer on the polished surface of the single-crystal substrate;
   forming a metal structure of a predetermined thickness on the thin semiconductor layer; and
   obtaining a composite metal-semiconductor substrate by removing the single-crystal substrate from the thin semiconductor layer;
   wherein one surface of the composite metal-semiconductor substrate is a semiconductor surface.

14. The method of claim 13, wherein forming the metal structure involves depositing a single-element metal or an alloy.

15. A high-quality metal substrate, wherein the high-quality metal substrate is produced by:
   cleaning a polished single-crystal substrate;
   forming a metal structure of a predetermined thickness on a polished surface of the single-crystal substrate; and
   removing the single-crystal substrate from the metal structure without damaging the metal structure to obtain the high-quality metal substrate; and
   wherein one surface of the high-quality metal substrate preserves the smoothness and flatness of the polished surface of the single-crystal substrate.

16. The high-quality metal substrate of claim 15,
   wherein the metal substrate comprises at least one unpolished high-quality metal surface; and
   wherein the unpolished high-quality metal surface inherits a preferred crystalline orientation of the polished surface of the single-crystal substrate.

17. The high-quality metal substrate of claim 15, wherein the high-quality metal structure comprises a single-element metal or an alloy.

18. The high-quality metal substrate of claim 15, wherein the high-quality metal structure comprises:
   multiple layers of single-element metals;
   multiple layers of alloys; or
   a combination of single-element metals layers and alloy layers.

19. The high-quality metal substrate of claim 15, wherein the high-quality metal structure has the following properties:
   a thickness not less than 10 µm;
   a surface-crystal-axis deviation angle not greater than 3°;
   a surface roughness not greater than 200 nm;
   a surface flatness not greater than 2 µm; and
   a radius of curvature not less than 0.5 m.

20. The high-quality metal substrate of claim 15, wherein removing the single-crystal substrate from the metal structure to obtain the metal substrate involves selectively etching away the single-crystal substrate without etching the metal structure.

21. The high-quality metal substrate of claim 20, wherein selectively etching away the single-crystal substrate involves using a chemical etching process.

22. The high-quality metal substrate of claim 15, wherein forming the metal structure on the polished surface of the single-crystal substrate involves using one or more of the following techniques:
- multi-arc ion deposition;
- radio-frequency (RF) magnetron sputtering deposition;
- direct-current (DC) magnetron sputtering deposition;
- ion beam sputtering deposition;
- electron-beam evaporation;
- thermal resistive evaporation; and
- electroplating.

23. The high-quality metal substrate of claim 15, wherein the single-crystal substrate is one of the following substrate with one or two polished surfaces:
- a silicon (Si) single-crystal substrate;
- a germanium (Ge) single-crystal substrate;
- a gallium arsenide (GaAs) single-crystal substrate;
- a gallium phosphide (GaP) single-crystal substrate;
- an indium phosphide (InP) single-crystal substrate; or
- any other semiconductor thin film epitaxial substrate.

24. The high-quality metal substrate of claim 15,
wherein the high-quality metal structure comprises one or more single-element metals or alloys;
wherein the high-quality metal structure comprises exhibits a predetermined thermal expansion coefficient.

25. The high-quality metal substrate of claim 15, wherein producing the high-quality metal substrate further involves patterning a raised wall-structure of a predetermined height on the polished surface of the single-crystal substrate prior to forming the metal structure, thereby allowing the resulting concave imprint of the wall-structure to divide the substrate surface into isolated flat regions.

26. The high-quality metal substrate of claim 15, wherein producing the high-quality metal substrate further involves etching a patterned trench-structure of a predetermined depth into the polished surface of the single-crystal substrate prior to forming the metal structure, thereby allowing the resulting raised wall-structure which coincides with the patterned trench-structure on the single-crystal substrate to divide the substrate surface into isolated flat regions.

27. A high-quality composite metal-semiconductor substrate, wherein the high-quality metal substrate is produced by:
- cleaning a polished single-crystal substrate;
- depositing a semiconductor layer on the polished surface of the single-crystal substrate;
- forming a metal structure of a predetermined thickness on the thin semiconductor layer; and
- obtaining the composite metal-semiconductor substrate by removing the single-crystal substrate from the thin semiconductor layer;

wherein one surface of the composite metal-semiconductor substrate is a semiconductor surface.

28. The high-quality composite metal-semiconductor substrate of claim 27, wherein forming the metal structure involves depositing a single-element metal or an alloy.

* * * * *